(12) United States Patent
Liu et al.

(10) Patent No.: US 12,456,635 B2
(45) Date of Patent: Oct. 28, 2025

(54) ROTATABLE ELECTROCHEMICAL ETCHING CELL

(71) Applicant: The Methodist Hospital, Houston, TX (US)

(72) Inventors: Xuewu Liu, Sugar Land, TX (US); Gauri Bhave, Richmond, TX (US)

(73) Assignee: The Methodist Hospital, Houston, TX (US)

( * ) Notice: Subject to any disclaimer, the term of this patent is extended or adjusted under 35 U.S.C. 154(b) by 0 days.

(21) Appl. No.: 18/980,720

(22) Filed: Dec. 13, 2024

(65) Prior Publication Data

US 2025/0112059 A1  Apr. 3, 2025

Related U.S. Application Data

(63) Continuation of application No. PCT/US2023/033412, filed on Sep. 21, 2023.

(60) Provisional application No. 63/409,129, filed on Sep. 22, 2022.

(51) Int. Cl.
| | | |
|---|---|---|
| C02F 1/469 | (2023.01) | |
| B01D 61/44 | (2006.01) | |
| B01D 61/46 | (2006.01) | |
| H01L 21/67 | (2006.01) | |

(52) U.S. Cl.
CPC .............. *H01L 21/67086* (2013.01)

(58) Field of Classification Search
None
See application file for complete search history.

(56) References Cited

U.S. PATENT DOCUMENTS

| | | | | |
|---|---|---|---|---|
| 3,679,565 A | * | 7/1972 | Gilchrist ................ | C25D 13/24 204/544 |
| 4,131,526 A | * | 12/1978 | Moeglich ................ | C02F 1/46 205/753 |
| 5,358,609 A | * | 10/1994 | Drackett ................ | C25B 1/30 205/466 |
| 6,280,599 B1 | * | 8/2001 | Osvath ................ | B01J 47/08 204/632 |
| 2010/0119920 A1 | * | 5/2010 | Logan ................ | H01M 4/8605 204/290.13 |
| 2011/0315561 A1 | * | 12/2011 | Rabaey ................ | H01M 8/16 210/605 |
| 2012/0292187 A1 | * | 11/2012 | Kim ................ | B01D 61/44 204/527 |
| 2013/0327353 A1 | * | 12/2013 | Field ................ | B08B 7/00 134/1 |

(Continued)

FOREIGN PATENT DOCUMENTS

WO WO-2024072691 A2 * 4/2024 ............ B01D 11/02

*Primary Examiner* — Sylvia MacArthur
(74) *Attorney, Agent, or Firm* — William R. Childs; Childs Patent Law PLLC (57) ABSTRACT

The present disclosure provides a reaction chamber, and methods of using the same, wherein the reaction chamber includes a mesh cathode, a first anode, a second anode, and a reaction chamber body, wherein the reaction chamber body is hollow and has a first opening and a second opening, where semiconductor wafers to be electrochemically etched can be sealed. One benefit of the reaction chamber and methods disclosed herein can be allowing for numerous etching operations to be performed with minimal or no contact of the operator with the etching solution, such as hydrofluoric acid.

16 Claims, 7 Drawing Sheets

(56) References Cited

U.S. PATENT DOCUMENTS

2023/0017930 A1\* 1/2023 Koseki .................... H01G 9/15

\* cited by examiner

ROTATABLE ELECTROCHEMICAL ETCHING CELL

CROSS-REFERENCE TO RELATED APPLICATIONS

This Application is a continuation and claims priority to PCT Application No. PCT/US23/33412, filed on Sep. 21, 2023 and claims priority to U.S. Provisional No. 63/409,129 filed on Sep. 22, 2022, the entirety of which is incorporated by reference.

GOVERNMENT SUPPORT

This invention was made with Government support under W81XWH-12-1-0414 and W81XWH-17-1-0389 awarded by the Department of Defense. The Government has certain rights in the invention.

TECHNICAL FIELD

The present disclosure generally relates to a reaction chamber for the electrochemical etching of semiconductor wafers. A benefit of the reaction chamber can include the ability to electrochemically etch multiple semiconductor wafers, in batch or series, using harmful etching solutions while minimizing the potential exposure of workers to the harmful etching solutions.

BACKGROUND

Hydrofluoric acid (HF) and hydrofluoric acid solutions are essential to the semiconductor industry. For example, porous silicon structures can be produced by electrochemically (EC) etching crystalline silicon in a hydrofluoric (HF) acid solution. The controlled, selective electrochemical etching of silicon can result in porous structures having various characteristics, depending on dopant levels, applied electrical current, and electrolyte concentration. Generally, an electrochemical etching apparatus is necessary to perform electrochemical (EC) etching.

However, hydrofluoric acid solutions are extremely dangerous. Hydrofluoric acid solutions can be fatal if absorbed through the skin, inhaled, or swallowed. HF containing solutions are infamous for their ability to pass through a worker's skin without the worker realizing they've been exposed to the HF solution, such that the burns are not detected until the next day when it's often too late to mitigate them. Even moderate exposures to concentrated HF solutions may result in death if untreated. Simply put, HF solutions are one of the most essential but dangerous substances in the semiconductor industry.

There is a need for a reaction chamber or electrochemical etching apparatus that allows for HF solutions to be safely applied to as many semiconductor wafers as possible while minimizing the risk of bringing the operator into contact with the HF solution. There is a need for a reaction chamber or electrochemical etching apparatus that efficiently uses, stores, and reuses HF solutions to electrochemically etch a series or batches of semiconductor wafers while minimizing unnecessary HF waste, handling, and storage.

SUMMARY

The present disclosure relates to a reaction chamber. In some embodiments, the reaction chamber comprises a mesh cathode, a first anode, a second anode, and a reaction chamber body, wherein the reaction chamber body is hollow and has an interior surface, an exterior surface, a first opening with a first lip, and a second opening with a second lip, wherein the first anode can be reversibly fastened to the first lip by a first fastener and the second anode can be reversibly fastened to the second lip by a second fastener. In some embodiments, the mesh cathode is positioned between the first opening and the second opening, wherein the mesh cathode is substantially parallel to the first lip. In some embodiments, an inner edge of the first lip has a shortest distance across the first opening of from about 2.5 cm to about 46.0 cm. In some embodiments, an inner edge of the of the second lip has a shortest distance across the second opening of from about 2.5 cm to about 46.0 cm. In some embodiments, the first opening has a circular shape having an internal diameter of from about 2.5 cm to about 46.0 cm, or the second opening has a circular shape having an internal diameter of from about 2.5 cm to about 46.0 cm. In some embodiments, the first opening and the second opening have a circular shape having an internal diameter from about 2.0 mm to about 5.0 mm less than the diameter of a semiconductor wafer. In some embodiments, the reaction chamber contains no more than one mesh cathode, and the mesh cathode is located within from about 0.0 mm to about 5.0 mm and substantially parallel to an equidistant line between the first anode and the second anode. In some embodiments, the mesh cathode is located from about 1.0 cm to about 10 cm to the first anode, or the mesh cathode is located from about 1.0 cm to about 10 cm to the second anode. In some embodiments, the reaction chamber contains a first mesh cathode and a second mesh cathode, wherein the first mesh cathode is located at a distance of from about 1.0 cm to about 10 cm from the first anode and substantially parallel to the first anode, or the second mesh cathode is located at a distance of from about 1.0 cm to about 10 cm from the second anode and substantially parallel to the second anode. In some embodiments, the first lip includes from 3 to 20 first pegs and a first recess that extends around the first opening, wherein the first recess is located closer to the interior surface than the pegs. In some embodiments, the second lip includes from 3 to 20 second pegs and a second recess that extends around the second opening, wherein the second recess is located closer to the interior surface than the second pegs. In some embodiments, the reaction chamber further comprises a first gasket, wherein the first gasket is configured to fit the first recess. In some embodiments, the reaction chamber further comprises a second gasket, wherein the second gasket is configured to fit the second recess. In some embodiments, at least one of the first gasket and the second gasket is an O-ring, wherein the first gasket and the second gasket comprise a rubber, an elastomer, or a fluoropolymer. In some embodiments, the reaction chamber body comprises a polymer or a fluoropolymer. In some embodiments, the mesh cathode comprises a nickel alloy or a nickel copper alloy. In some embodiments, at least one of the first anode and the second anode comprises a nickel alloy, a nickel copper alloy, a p-doped silicon plate, or an n-doped silicon plate, or a combination thereof. In some embodiments, the mesh cathode is electrically connected through the reaction chamber body to a DC power source. In some embodiments, the reaction chamber body comprises a liquid port, wherein the liquid port is a tube that extends through the reaction chamber body through the exterior surface to the exterior surface.

A method of operating a reaction chamber is disclosed herein. In some embodiments, the method comprises: providing a reaction chamber, wherein the reaction chamber includes: a mesh cathode, a first anode, a second anode, and a reaction chamber body, wherein the reaction chamber body is hollow and has an interior surface, an exterior surface, a first opening with a first lip, and a second opening with a second lip, wherein the mesh cathode is positioned between the first opening and the second opening and the mesh cathode is substantially parallel to the first lip, wherein the first anode can be reversibly fastened to the first lip by a first fastener and the second anode can be reversibly fastened to the second lip by a second fastener; forming a sealed reaction chamber by, forming a first seal between a first semiconductor wafer and the first lip by positioning the first semiconductor wafer between the first lip and the first anode, and forming a second seal between a second semiconductor wafer and the second lip by positioning the second semiconductor wafer between the second lip and the second anode, and adding a reactant to the sealed reaction chamber.

In some embodiments, the method further comprises orienting the sealed reaction chamber by positioning the second anode substantially perpendicular to gravity and closer to a ground than the first anode, and etching a second surface of the second semiconductor wafer by applying a DC current between the mesh cathode and the second anode. In some embodiments, the method further comprises: orienting the sealed reaction chamber by positioning the first anode substantially perpendicular to gravity and closer to the ground than the second anode, and etching a first surface of the first semiconductor wafer by applying a DC current between the mesh cathode and the first anode. In some embodiments, the method further comprises removing the second semiconductor wafer before, during, or after etching the first semiconductor wafer. In some embodiments, the method further comprises orienting the sealed reaction chamber by positioning the first anode substantially perpendicular to gravity and closer to a ground than the second anode, and etching a first surface of the first semiconductor wafer by applying a DC current between the mesh cathode and the first anode. In some embodiments, the method further comprises orienting the sealed reaction chamber by positioning the second anode substantially perpendicular to gravity and closer to a ground than the first anode, and etching a second surface of the second semiconductor wafer by applying a DC current between the mesh cathode and the second anode. In some embodiments, the reactant comprises HF.

In some embodiments, the method further comprises etching a first surface of the first semiconductor wafer by applying a DC current between the mesh cathode and the first anode, and then etching a second surface of the second semiconductor wafer by applying a DC current between the mesh cathode and the second anode. In some embodiments, the method comprises etching a second surface of the second semiconductor wafer by applying a DC current between the mesh cathode and the second anode, and then etching a first surface of the first semiconductor wafer by applying a DC current between the mesh cathode and the first anode.

BRIEF DESCRIPTION OF THE DRAWINGS

The foregoing summary, as well as the following detailed description of the embodiments, will be better understood when read in conjunction with the attached drawings. For the purpose of illustration, there are shown in the drawings some embodiments, which may be preferable. It should be understood that the embodiments depicted are not limited to the precise details shown. Unless otherwise noted, the drawings are not to scale.

DETAILED DESCRIPTION

Unless otherwise noted, all measurements are in standard metric units.

Unless otherwise noted, all reactions are performed under standard atmospheric pressure and temperature.

Unless otherwise noted, all instances of the words "a," "an," or "the" can refer to one or more than one of the word that they modify.

Unless otherwise noted, the phrase "at least one of" means one or more than one of an object. For example, "at least one of the first anode and the second anode comprises a nickel alloy, a nickel copper alloy, a p-doped silicon plate, or an n-doped silicon plate, or a combination thereof" means a single first anode, multiple first anodes, a first anode comprising multiple anodes, a single first cathode, multiple first cathodes, a first cathode comprising multiple cathodes, or any combination thereof comprising "a nickel alloy, a nickel copper alloy, a p-doped silicon plate, or an n-doped silicon plate, or a combination thereof."

Unless otherwise noted, the term "about" refers to ±10% of the non-percentage number that is described, rounded to the nearest number to the accuracy shown. For example, about 105.3 mm, would include 94.8 mm to 115.8 mm. Unless otherwise noted, the term "about" refers to ±5% of a percentage number. For example, about 20% would include 15 to 25%. When the term "about" is discussed in terms of a range, then the term refers to the appropriate amount less than the lower limit and more than the upper limit. For example, from about 100.0 mm to about 200.0 mm would include from 90.0 mm to 220.0 mm.

Unless otherwise noted, when referring to an object oriented in space relative to another object, the term "substantially" refers to plus or minus 10 degrees. For example, a cathode that is "substantially parallel" to a first lip, is parallel within plus or minus 10 degrees. When referring to an object oriented in space relative to the ground, earth, or gravity, then "substantially" refers to plus or minus 25 degrees. For example, a second anode that is "substantially perpendicular" to gravity means that the anode is perpendicular to gravity within plus or minus 25 degrees of the earth's gravitational pull.

Unless otherwise noted, the terms "provide", "provided" or "providing" refer to the supply, production, purchase, manufacture, assembly, formation, selection, configuration, conversion, introduction, addition, or incorporation of any element, amount, component, reagent, quantity, measurement, or analysis of any method or system of any embodiment herein.

Unless otherwise noted, the term "reversibly fastened" or "reversible sealed" refers binding or sealing one object to another object through mechanical means, and excludes welding or chemically binding the objects together.

Unless otherwise noted, the term "mesh" refers to an object made of interwoven wires or strands.

Unless otherwise noted, the term "recess" refers to a spatial depression, hole, trench, impression, carving, or 3-dimensional pattern into a material of a surface.

In many embodiments, the reaction chamber disclosed here is symmetrical by design. Therefore, unless otherwise noted, the terms "first," "second," "third," and "fourth" are arbitrary designators that distinguish one end or opening of the reaction chamber, and the parts thereof, from another end or opening and the parts thereof. That is, these terms merely indicate which opening, or parts associated therewith, are being referred to. Unless otherwise noted, the terms "first," "second," "third," and "fourth," do not imply a sequence, order, or orientation.

Unless otherwise noted, properties (height, width, length, ratio etc.) as described herein are understood to be averaged measurements.

Most reported porous silicon research and manufacturing makes use of a basic electrochemical (EC) etching cell and a direct current power supply. There are two types of basic EC cell configuration conventionally used. For the sake of comparison, these are illustrated in FIG. 1 and FIG. 2 of the present disclosure.

Figure 1:
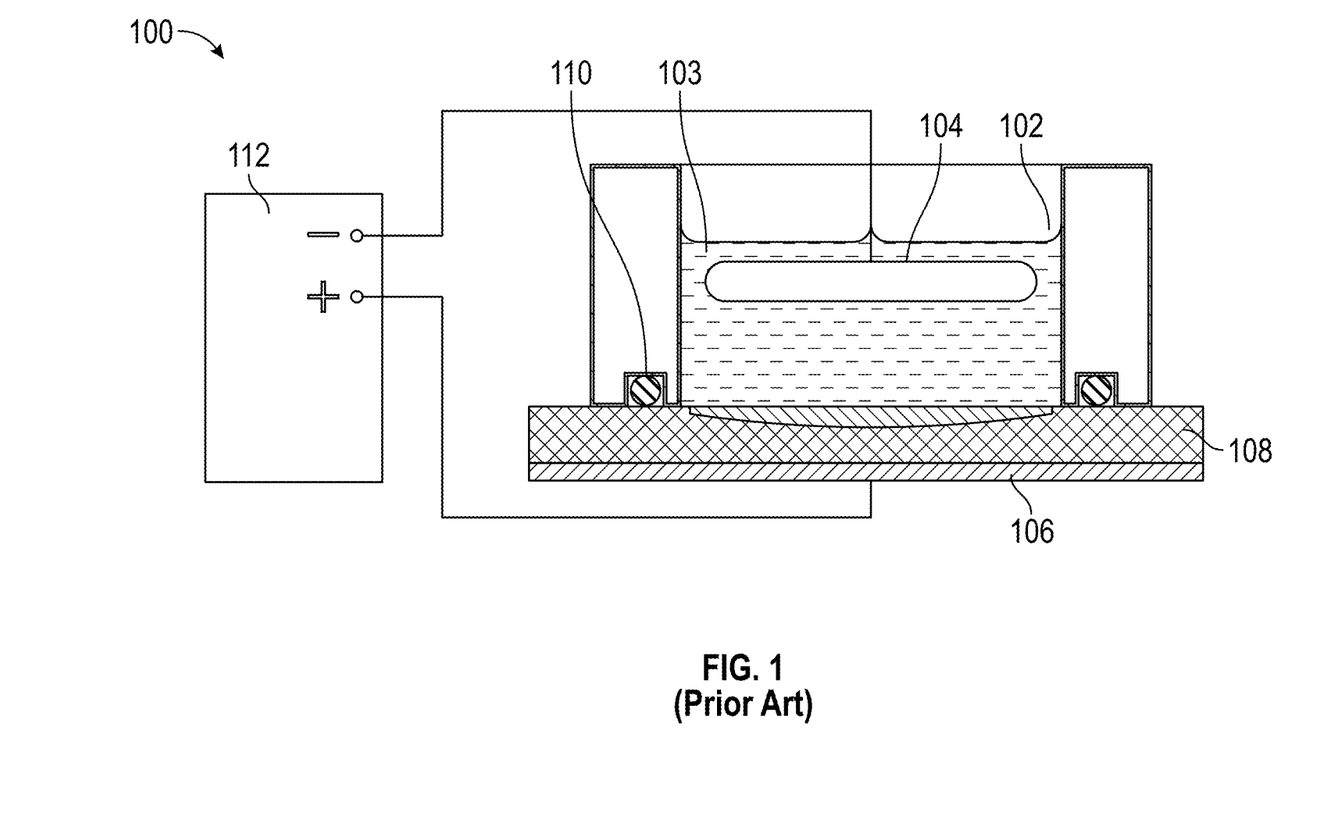
FIG. 1 is a schematic depiction of a conventional electrochemical etching apparatus.

As illustrated in FIG. 1, the first EC cell configuration 100 consists of an open cylindrical tank 102 filled with an HF solution 103, a cathode 104, and a solid anode 106, wherein the solid cathode provides for horizontal mounting of a semiconductor wafer 108 between the anode and the HF solution. The semiconductor wafer is sealed against a seal 110 at the bottom of the tank to prevent or reduce leaking of the HF solution. The EC cell is powered by a DC voltage power supply 112. This conventional EC cell requires that each semiconductor wafer to be etched must be individually added and removed separately because the HF bath is resting on top of the wafer being etched. Further, between the etching of each wafer, the HF acid bath must be drained and properly stored before proceeding to add and etch another wafer, which greatly slows the etching process for high volume production and increases the possibility of chemical spills and burns.

Figure 2:
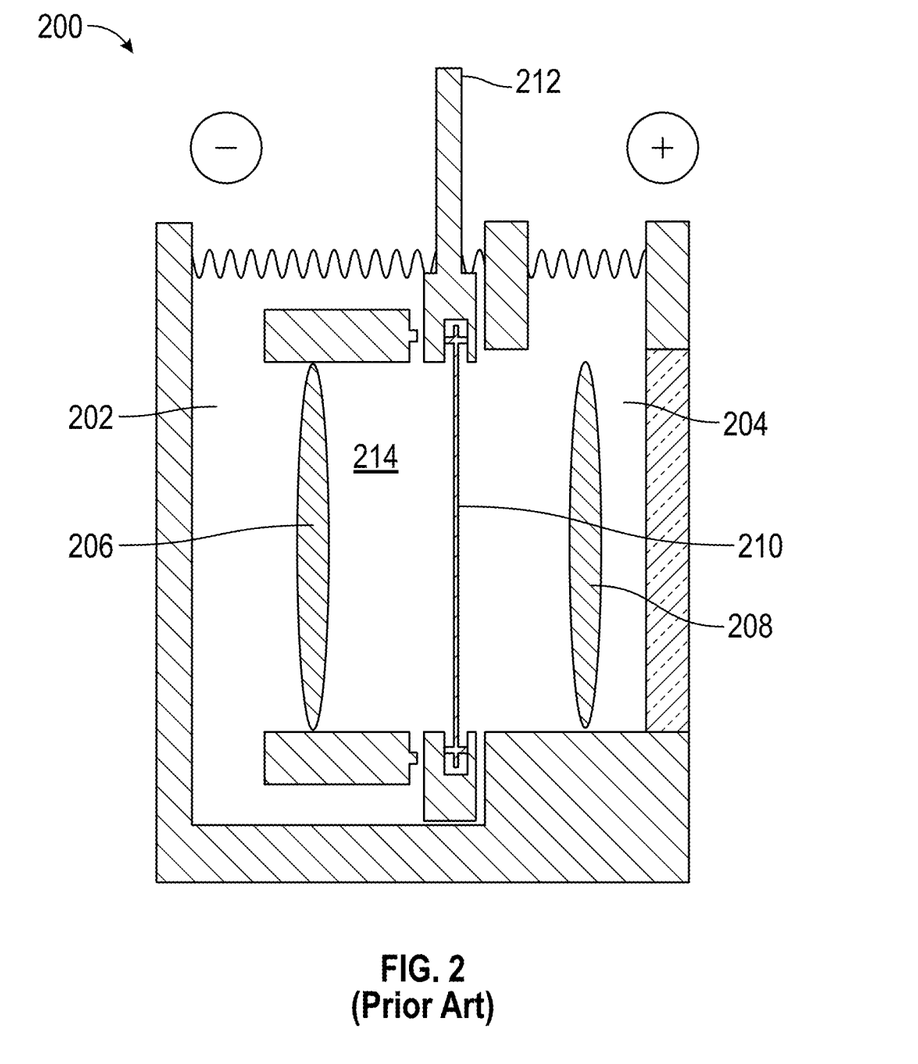
FIG. 2 is a schematic depiction of another conventional electrochemical etching apparatus.

Referring to FIG. 2, another conventional EC cell 200 configuration consists of two chambers 202 and 204, wherein the chamber 202 includes a cathode 206 and the chamber 204 includes an anode 208. A wafer 210 is mounted onto a wafter holder 212 and inserted between the chambers 202 and 204 for vertical wafer etching, wherein both the chambers 202, 204 are filled with an etching solution 214 (e.g. HF solution). This conventional EC cell exposes an operator to many of the same risks as the EC cell shown in FIG. 1 because it requires an operator to bring each sample into contact with the HF solution using a wafer holder, which increases the possibility of HF spills, splashes, and the contamination of surfaces. Also, each sample must still be added and removed separately, which greatly slows the etching process for high volume production and increases the possibility of contamination and worker injury. When a batch of wafers is finished processing, then the HF acid bath must still be drained and properly stored between etchings until the HF is depleted from the HF solution. The main improvement between the conventional reaction chamber of FIG. 2 over the conventional reaction chamber of FIG. 1, is that the HF solutions of FIG. 2 can be reused between individual wafers, instead of having to be drained between each wafer etched.

The present disclosure provides a reaction chamber or electrochemical apparatus capable of solving the abovementioned problems. In some embodiments, one or more substrates to be processed, such as a silicon semiconductor wafer can be positioned and sealed over various openings by gaskets or O-rings to provide a sealable reaction chamber for electrochemical etching that safely contains a HF solution. Moreover, one substrate or semiconductor wafer can be safely added or removed before, during, or after the etching of another substrate or silicon wafer. A benefit of the presently disclosed reaction chamber can be that semiconductor wafers can be added to the reaction chamber, etched, and then removed without the need for an operator or worker to come into contact with the HF solution, directly or through a handheld tool. This benefit can eliminate or reduce the risk of HF spills, splashes, and the contamination of surfaces. Another benefit of the presently disclosed reaction chamber can be that an HF solution can be used, stored, reused, and even replenished in the presently disclosed reaction chamber without needing to drain the HF solution. For example, the HF solution can be reused or stored in the reversibly sealable reaction chamber until the solution is depleted through etching of HF. This single point of storage and depletion would greatly decrease the risk of HF solution exposure to workers because it eliminates or reduces the step of repeatedly filling and draining HF solutions from the reaction chamber.

Figure 3A:
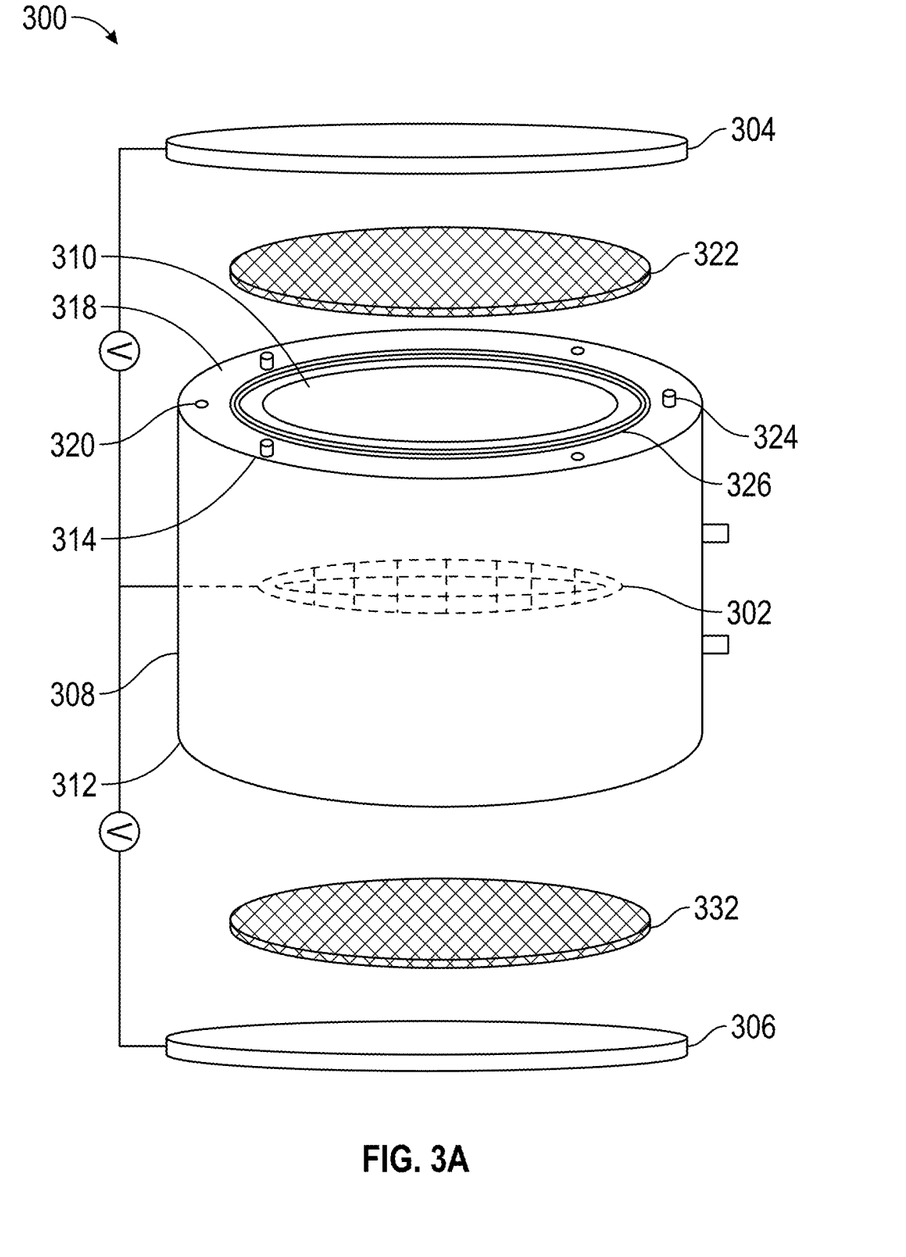
FIG. 3A is an exploded view of an embodiment of the reaction chamber disclosed herein.
Figure 3B:
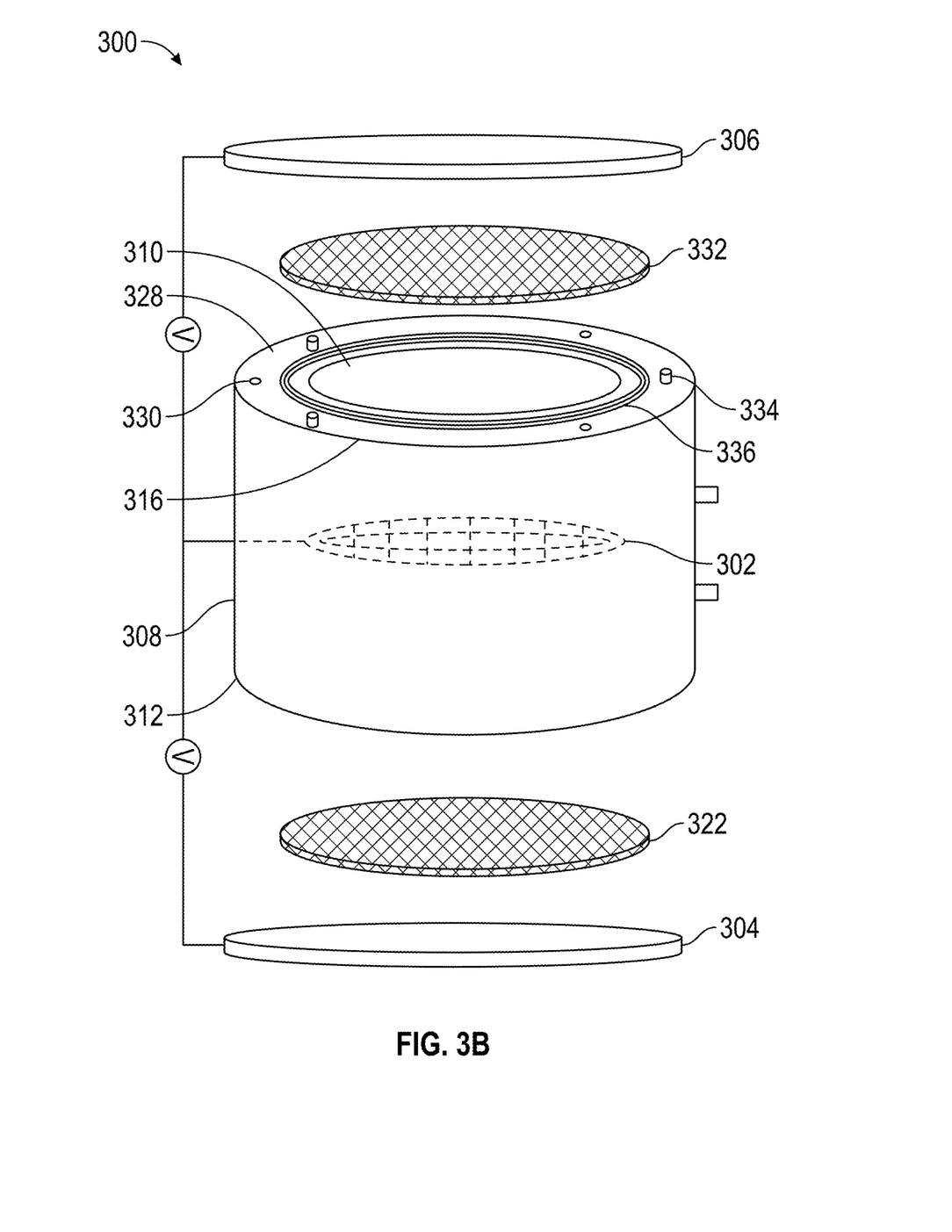
FIG. 3B is an exploded view of the embodiment of the reaction chamber shown in FIG. 3 A, except turned upside down or rotated 180 degrees around the cathode.

In some embodiments, a reaction chamber is disclosed. FIGS. 3A and 3B illustrate exploded views of some embodiments of reaction chambers disclosed herein. As can be seen from FIGS. 3A and 3B, the reaction chamber 300 includes a mesh cathode 302, a first anode 304, a second anode 306, and a reaction chamber body 308. In some embodiments, the reaction chamber body 308 is hollow and defines an interior surface 310, an exterior surface 312, a first opening 314, and a second opening 316. In this embodiment, FIG. 3 A and FIG. 3B show the same embodiment from different views: FIG. 3A with the first opening facing up and FIG. 3B with the second opening facing up.

As can be best viewed from FIG. 3A, the first opening 314 has a first lip 318. The first anode 304 can be reversibly fastened to the first lip 318 by a first fastener 320. A first semiconductor wafer 322 can be positioned between the first lip 318 and the first anode 304. In some embodiments, the first lip 318 includes a first peg 324 and a first recess 326 that extends around the first opening 314. In some embodiments, the first recess 326 is located closer to the interior surface 310 than the first peg 324. In some embodiments, the first lip 318 includes from 3 to 20 first pegs, collectively, shown as 324.

As can be seen from FIG. 3B, the second opening 316 has a second lip 328. The second anode 306 can be reversibly fastened to the second lip 328 by a second fastener 330. In some embodiments, a second semiconductor wafer 332 is positioned between the second lip 328 and the second anode 306. In some embodiments, the second lip 328 includes a second peg 334 and a second recess 336 that extends around the second opening 316. In some embodiments, the second recess 336 is located closer to the interior surface 310 than the second peg 334. In some embodiments, the second lip 328 includes from 3 to 20 second pegs, collectively, shown as 334.

Figure 4:
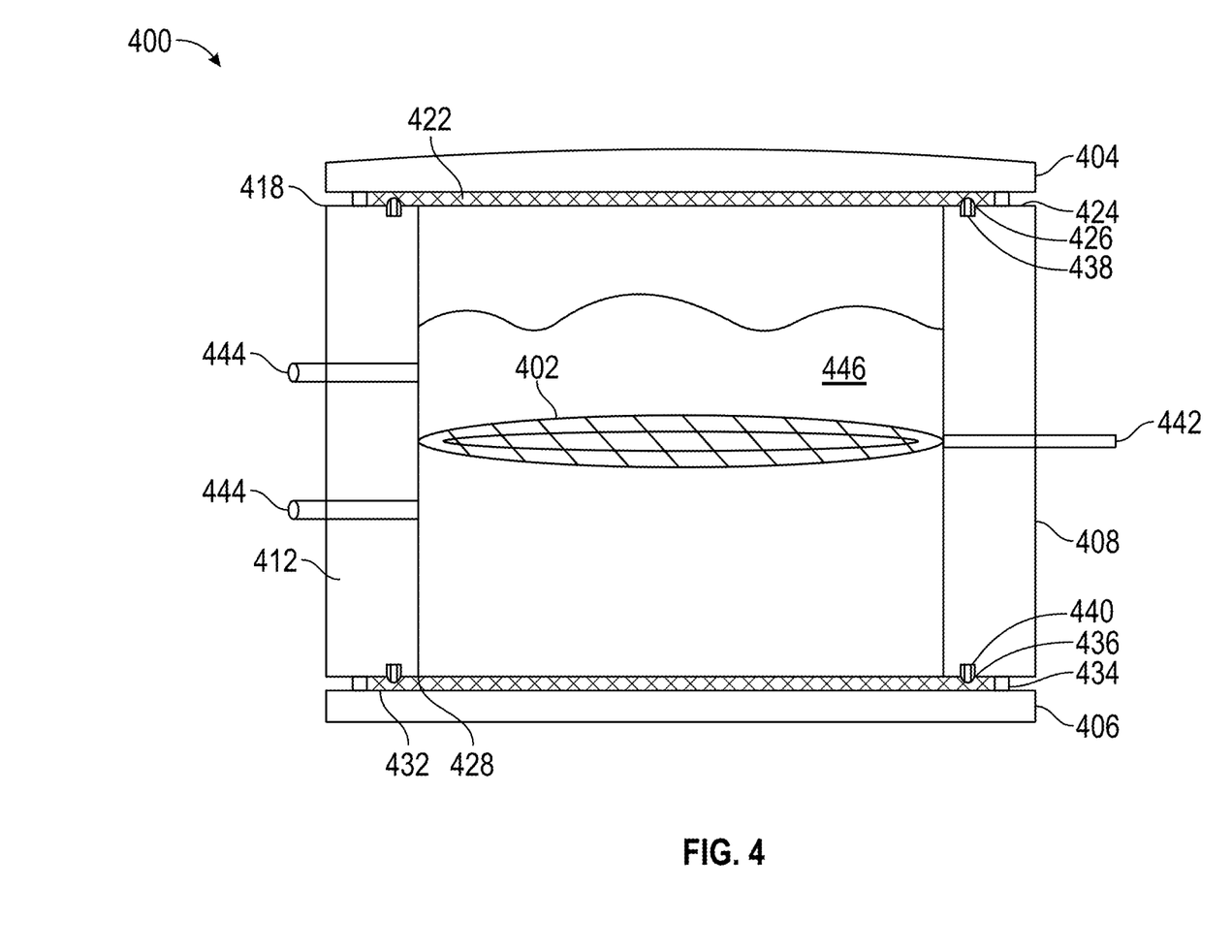
FIG. 4 is a schematic depiction showing a cut away view of an embodiment of the reaction chamber disclosed herein, during operation.

In some embodiments, referring to FIGS. 3A and 3B, the mesh cathode 302 is positioned between the first opening 314 and the second opening 316, and the mesh cathode 302 is substantially parallel to the first lip 318. Referring to FIG. 4, this illustration shows a cut away diagram of some embodiments of the reaction chamber disclosed herein. As can be seen from FIG. 4, the reaction chamber 400 includes a mesh cathode 402, a first semiconductor wafer 422 positioned or fastened between the first anode 404 and the first lip 418 as well as a second semiconductor wafer 432 positioned or fastened between a second anode 406 and the second lip 428, with a hollow reaction chamber body 408 between the first and second anodes.

As can also be seen from FIG. 4, the first lip 418 and the second lip 428 feature pegs, collectively shown as 424 and 434, respectively, that can assist in positioning of the respective wafer before or during etching. The reaction chamber 400 includes a first gasket 438 configured to fit the first recess 426 and a second gasket 440 configured to fit the second recess 436 to create a reversibly sealable and leakproof reaction chamber.

In some embodiments, at least one of the first gasket 438 and the second gasket 440 is an O-ring. In some embodiments, the mesh cathode 402 is electrically or operatively connected through the reaction chamber body 408 to a DC power source by a cathode lead 442. In some embodiments, the reaction chamber body 408 comprises a liquid port, collectively shown as 444, wherein the liquid port 444 is a tube or tubes that extends through the reaction chamber body 408 to the exterior surface 412. These tubes can be used to fill the reversibly sealable reaction chamber with an HF containing solution 446, even while the etching chamber is sealed during the etching process.

Figure 5:
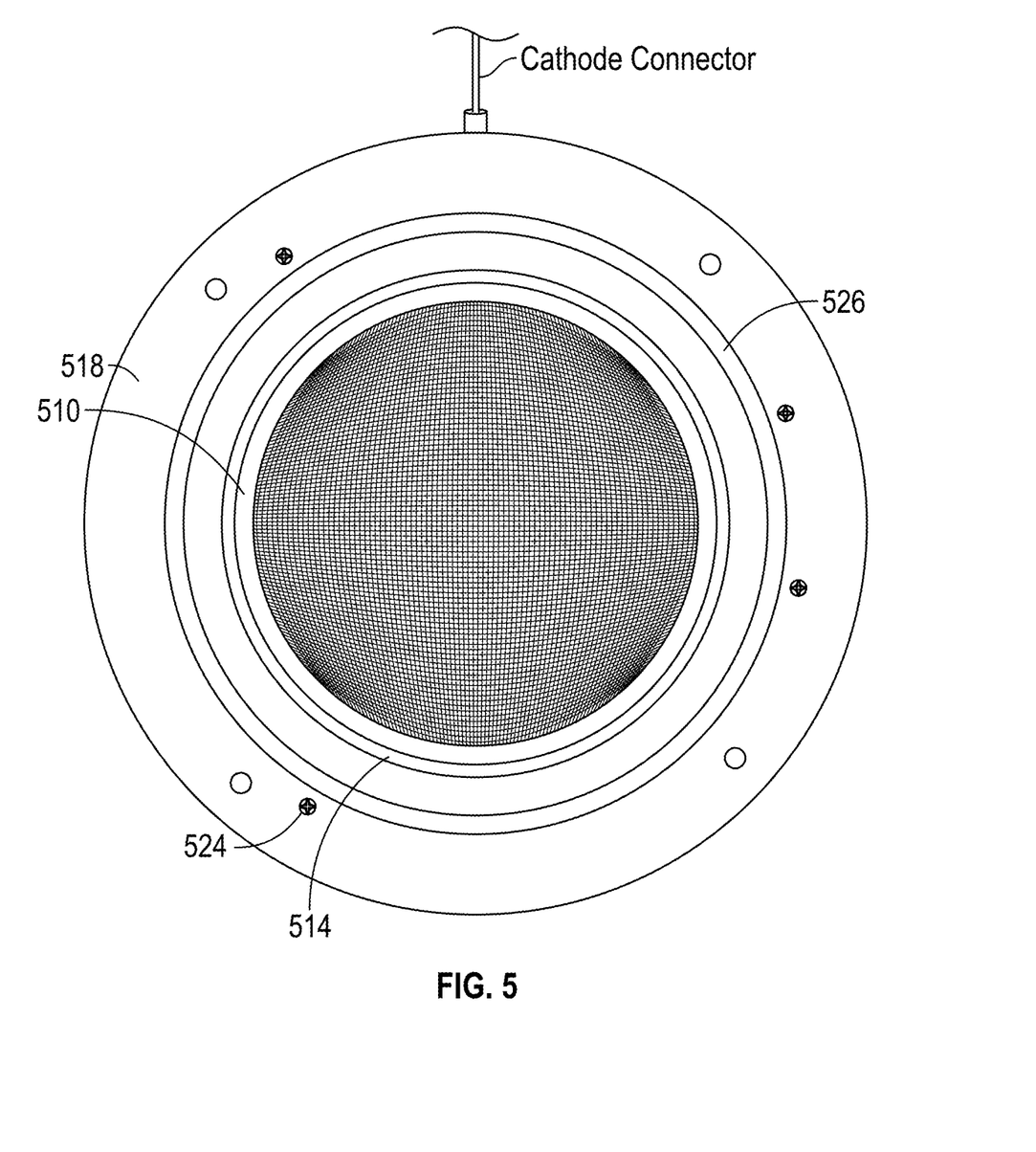
FIG. 5 is a top view of the reaction chamber with the first anode and first semiconductor wafer removed.

FIG. 5 illustrates a top view of an embodiment of the reaction chamber without the first anode and the first semiconductor wafer. As can be seen from FIG. 5, the first lip 518 includes a plurality of first pegs, collectively shown as 524, and a first recess 526 that extends around the first opening 514, wherein the first recess 526 is located closer to the interior surface 510 than the first peg 524.

The reaction chamber illustrated in FIGS. 3-5 allows for the EC cell to be reversibly sealed with the etching solution inside by mounting one semiconductor wafer over each opening. This ability to seal all openings of the reaction chamber can allow for embodiments of the presently disclosed reaction chamber or electrochemical etching apparatus to be moved around, rotated, flipped, or even shaken with no risk or reduced risk of spilling hazardous etching chemicals, such as HF acid. Moreover, when the second opening is facing down and the first is facing up, then the first semiconductor wafer can be removed and replaced by a new semiconductor wafer (unetched) for electrochemical etching, because the HF solution is resting on the bottom of the reaction chamber. Once the electrochemical etching of the second semiconductor wafer is complete and the first semiconductor wafer is safely sealed over the first opening, then the entire reaction chamber can be rotated, such that the first opening is facing down, and the second opening is facing up. Then the second semiconductor wafer can be removed before, during, or after etching the first semiconductor wafer. This electrical chemical etching process can be repeated as needed while avoiding worker contact with the HF solution.

The present disclosure relates to a reaction chamber. In some embodiments, the reaction chamber comprises a mesh cathode, a first anode, a second anode, and a reaction chamber body. In some embodiments, the reaction chamber body is hollow and has an interior surface, an exterior surface, a first opening with a first lip, and a second opening with a second lip. In some embodiments, the first anode can be reversibly fastened to the first lip by a first fastener and the second anode can be reversibly fastened to the second lip by a second fastener.

In some embodiments, the reaction chamber is a reversibly sealable electrochemical cell for semiconductor etching. In some embodiments, the mesh cathode can be made of any etching solution compatible conductive material, such as an HF acid compatible material, including a nickel alloy, a nickel copper alloy or other conductive noble metals, but not necessarily limited thereto. In some embodiments, the mesh cathode comprises a nickel alloy or a nickel copper alloy. In some embodiments, the mesh cathode is porous. In some embodiments of the reaction chamber, the cathode can be a mesh cathode or a porous cathode. A benefit of a mesh cathode or porous cathode is that such a cathode can permit the etching solution (e.g. HF solution) to freely pass from one side of the reaction chamber to the other side, eliminating or reducing the buildup of gases on the cathode. In contrast, a non-mesh cathode can result in bubbles being formed on a surface of the cathode, which would produce irregularities in the electrical field on the surface of the semiconductor, resulting in uneven etching. Similarly, if the cathode does not extend evenly across the width of the semiconductor wafer or the inner surface of the interior edge of the reaction chamber body, then a gradient in the electrical field on the surface of the semiconductor can form, resulting in uneven etching.

In some embodiments, the reaction chamber may house one or more mesh cathodes for processing multiple substrates or semiconductor wafers simultaneously. For example, the reaction chamber may house a single mesh cathode placed substantially parallel to an equidistant line between the first anode and the second anode such that the cathode extends evenly across the chamber relative to the anodes precluding or reducing variation in the chemical etching due to the unintentional formation of an electrochemical etching gradient. In another example, the reaction chamber may house two mesh cathodes, such that one of the mesh cathodes is positioned substantially parallel to one of the anodes.

In some embodiments, the reaction chamber contains no more than one mesh cathode. In some embodiments, the mesh cathode is located within from about 0.0 mm to about 5.0 mm and substantially parallel to an equidistant line between the first anode and the second anode. In some embodiments, the mesh cathode is located from about 1.0 cm to about 10 cm to the first anode, or the mesh cathode is located from about 1.0 cm to about 10 cm to the second anode or both.

In some embodiments, the reaction chamber contains a first mesh cathode and a second mesh cathode, wherein the first mesh cathode is located at a distance of from about 1.0 cm to about 10 cm from the first anode and substantially parallel to the first anode. In some embodiments, the reaction chamber contains a first mesh cathode and a second mesh cathode, and the second mesh cathode is located at a distance of from about 1.0 cm to about 10 cm from the second anode and substantially parallel to the second anode.

In some embodiments, the mesh cathode is positioned between the first opening and the second opening, wherein the mesh cathode is substantially parallel to the first lip. In some embodiments, the mesh cathode is operatively or electrically connected through the reaction chamber body to a power source, such as a direct current (DC) power source.

In some embodiments, the first opening and the second opening can be of any shape, such as circular, square, or the like, being varied as needed to match or complement the shape of the semiconductor wafer to be etched. For example, by convention, semiconductor wafers in the microchip industry are usually round, whereas semiconductor wafers solar cell industry are typically square.

In some embodiments, the first opening and the second opening can have the same or different shapes. In some embodiments, the first opening and the second opening can be of any size so long as the semiconductor wafers can be reversibly sealed against the first opening or the second opening. In some embodiments, the first opening has a circular shape having an internal diameter of from about 2.5 cm to about 46.0 cm. In some embodiments, the second opening has a circular shape having an internal diameter of from about 2.5 cm to about 46.0 cm. In some embodiments, the first opening and the second opening have a circular shape having an internal diameter from about 2.0 mm to about 5.0 mm less than the diameter of a semiconductor wafer, such as a semiconductor wafer in commercial production. In some embodiments, an inner edge of the first lip has a shortest distance across the first opening of from about 2.5 cm to about 46.0 cm. In some embodiments, an inner edge of the of the second lip has a shortest distance across the second opening of from about 2.5 cm to about 46.0 cm.

In some embodiments, the first and second lips can include a plurality of pegs to aid in alignment and mounting of the wafer. A benefit of such pegs can be to assist an operator with quickly, easily, and consistently aligning semiconductor wafers with an opening to provide a consistent area of contact for the etching solution. A benefit of such pegs can be avoiding spills, because a misalignment of the semiconductor wafer can lead to a poorly sealed reaction chamber.

In some embodiments, the first and second lips can include one or more recesses extending around the respective openings for receiving or housing gaskets, such as O-ring. A benefit of a recess and gasket on a lip of the reaction chamber can be to provide a sealed leak-proof chamber or a liquid tight reversibly sealable chamber, which in turn, reduces the risk of leaks of harmful chemicals during repeated use. In some embodiments, the first lip includes from 3 to 20 first pegs and a first recess that extends around the first opening, wherein the first recess is located closer to the interior surface than the pegs. In some embodiments, the pegs are located closer to the interior surface than the first recess. In some embodiments, the second lip includes from 3 to 20 second pegs and a second recess that extends around the second opening, wherein the second recess is located closer to the interior surface than the pegs. In some embodiments, the pegs are located closer to the interior surface than the second recess.

In some embodiments, at least one of the first gasket and the second gasket is an O-ring. In some embodiments, the first gasket and the second gasket can be made of any material resistant and inert to the etching solution, including HF acid or an HF solution. In some embodiments, the first gasket and the second gasket comprise a rubber, an elastomer, or a fluoropolymer.

In some embodiments, the reaction chamber body can be made of any non-conductive material that is resistant and inert to the etching solution, such as one or more non-conductive fluorinated polymers. In some embodiments, the reaction chamber body comprises a polymer or a fluoropolymer. In some embodiments, the reaction chamber body comprises a liquid port or a gas port, wherein the liquid port is a tube or channel that extends through the reaction chamber body from the exterior surface to the interior surface. In some embodiments, the reaction chamber body can include a liquid port that includes 2 or more tubes. A benefit of 2 or more tubes can be attaching one on to a source of etching solutions, such as a container, and attaching another to a drain for removing etching solutions.

In some embodiments, the first anode and the second anode can be made of any etching solution compatible conductive material, such as a nickel alloy and a nickel copper alloy, but not necessarily limited thereto. In some embodiments, at least one of the first anode and the second anode comprises a nickel alloy, a nickel copper alloy, a p-doped silicon plate, or an n-doped silicon plate, or a combination thereof.

In operation, some embodiments of the reaction chamber can be assembled by positioning the first semiconductor wafer on the first lip, aligning the first semiconductor wafer with the O-ring, maybe with the help of first pegs. Then, the first anode can be positioned and fastened to the first lip with the help of the first fasteners (such as screws or bolts), such that the first semiconductor wafer is sandwiched, contained, or positioned between the first anode and first lip. Further, in some embodiments, the reaction chamber can be flipped or turned such that the first anode faces the ground, and then positioning the second semiconductor wafer on the second lip, aligning the second semiconductor wafer with the O-ring, maybe with the help of second pegs. Then, the second anode can be positioned and fastened to the second lip with the help of the second fasteners (such as screws or bolts), such that the second semiconductor wafer is sandwiched, contained, or positioned between the second anode and second lip. In some embodiments, an etching solution can be added to the reaction chamber before, during, or after positioning the second semiconductor wafer on the second lip. For example, in some embodiments, the etching solution can be added to a sealed (or otherwise sealed) etching chamber using a liquid port.

In some embodiments, the sealed reaction chamber can be oriented such that the anode corresponding to the wafer that needs to be etched earlier in time is substantially perpendicular to gravity and closer to the ground or earth than the other anode. In some embodiments, the requisite DC current can be applied between the mesh cathode and the anode closer to the ground to effect etching of the corresponding semiconductor wafer. A benefit of applying DC current to the etching solution can be to facilitate electrochemical etching. For example, crystalline silicon can only be appreciably etched by an HF solution when a DC current is applied.

As mentioned above, the terms "first" and "second" are arbitrarily assigned adjectives that designate or refer to an opening of the reaction chamber and the characteristics and parts associated with that opening, such that they provide context instead of sequence or orientation information. For example, the sealed reaction chamber can be oriented such that the first anode is substantially perpendicular to gravity and closer to the ground than the second anode (exposing the first semiconductor wafer to the etching solution), DC current is applied between the mesh cathode and the first anode to effect etching of the first semiconductor wafer. Then once etching of the first semiconductor wafer is complete, the reaction cell or reaction chamber can be flipped, rotated, or turned-over such that the second anode is substantially perpendicular to gravity and closer to the ground than the first anode, exposing the second semiconductor wafer to the etching solution. Then, a DC current can then be applied between the mesh cathode and the second anode to effect etching of the second semiconductor wafer.

In some embodiments of the method, the first etched semiconductor wafer can be removed and/or be replaced with a new semiconductor (thus becoming a new or unetched first etched semiconductor wafer) before, during, or after etching the second semiconductor wafer. For example, after completion of etching of the first semiconductor wafer, the reaction cell can be flipped, turned over, or rotated, such that the second anode is closer to the ground exposing the second semiconductor wafer to the etching solution. Then, a DC current can be applied between the mesh cathode and the second anode for etching the second semiconductor wafer. While the etching of the second semiconductor wafer is being performed, the first etched semiconductor wafer can be removed from the reaction chamber by unfastening the first anode from the first lip, and a new first semiconductor wafer (to be etched) or unetched first semiconductor wafer can be positioned in place of the first etched semiconductor wafer.

Once the etching of the second semiconductor wafer is completed, the reaction cell can again be flipped, turned over, or rotated, such that the first anode is closer to the ground, exposing the third semiconductor wafer to the etching solution. In some embodiments of the method, this process can be repeated to effect etching of a series of semiconductor wafers. A benefit of the reaction chamber disclosed herein, and methods of using the same, can be that they provide for a continuous etching process, such that the same etching solution is reused until depleted, avoiding or reducing the need of draining or storing the etching solution after each etching cycle.

Electrochemical etching of semiconductor wafers (such as silicon-based semiconductor wafers) consumes the etching solution (e.g. HF acid) leading to depletion of the etching solution during the etching operation. In some embodiments of the method, the consumed etching solution can be compensated or replenished by adding fresh etching solution to the reaction chamber. For example, the fresh etching solution may be added to the reaction chamber during replacement of a semiconductor wafer or removal of the etched semiconductor wafer. Alternatively, a fresh etching solution can be added to the sealed reaction chamber through a liquid port, either intermittently or continuously.

A method of operating a reaction chamber is disclosed herein. In some embodiments, the method comprises: providing a reaction chamber, wherein the reaction chamber includes: a mesh cathode, a first anode, a second anode, and a reaction chamber body. In some embodiments of the method, the reaction chamber body is hollow and has an interior surface, an exterior surface, a first opening with a first lip, and a second opening with a second lip. In some embodiments of the method, the mesh cathode is positioned between the first opening and the second opening, and the mesh cathode is substantially parallel to the first lip. In some embodiments of the method, the first anode can be reversibly fastened to the first lip by a first fastener and the second anode can be reversibly fastened to the second lip by a second fastener. In some embodiments of the method, the method comprises: forming a sealed reaction chamber by, forming a first seal between a first semiconductor wafer and the first lip by positioning the first semiconductor wafer between the first lip and the first anode, and forming a second seal between a second semiconductor wafer and the second lip by positioning the second semiconductor wafer between the second lip and the second anode. In some embodiments of the method, the method comprises: adding a reactant to the sealed reaction chamber. In some embodiments, the method of sealing the reaction chamber can eliminate or reduce possible solution leaks and contamination.

In some embodiments, the method further comprises orienting the sealed reaction chamber by positioning the second anode substantially perpendicular to gravity and closer to a ground than the first anode, and etching a second surface of the second semiconductor wafer by applying a DC current between the mesh cathode and the second anode. In some embodiments, the method further comprises: orienting the sealed reaction chamber by positioning the first anode substantially perpendicular to gravity and closer to the ground than the second anode, and etching a first surface of the first semiconductor wafer by applying a DC current between the mesh cathode and the first anode. In some embodiments, the method further comprises removing the second semiconductor wafer before, during, or after etching the first semiconductor wafer.

In some embodiments, the method further comprises orienting the sealed reaction chamber by positioning the first anode substantially perpendicular to gravity and closer to a ground than the second anode, and etching a first surface of the first semiconductor wafer by applying a DC current between the mesh cathode and the first anode. In some embodiments, the method further comprises orienting the sealed reaction chamber by positioning the second anode substantially perpendicular to gravity and closer to a ground than the first anode, and etching a second surface of the second semiconductor wafer by applying a DC current between the mesh cathode and the second anode. In some embodiments, the reactant comprises HF or a solution containing HF.

In some embodiments, the method further comprises etching a first surface of the first semiconductor wafer by applying a DC current between the mesh cathode and the first anode, and then etching a second surface of the second semiconductor wafer by applying a DC current between the mesh cathode and the second anode. In some embodiments, the method comprises etching a second surface of the second semiconductor wafer by applying a DC current between the mesh cathode and the second anode, and then etching a first surface of the first semiconductor wafer by applying a DC current between the mesh cathode and the first anode. In some embodiments, the anodes do not come in contact with the etching solution and keep dry through-out the process. A benefit of avoiding or reducing contact of the anodes with the etching solution can be to eliminate or reduce contamination, corrosion, and cleaning steps.

While FIGS. 3-5 illustrate embodiments of a reaction chamber with two openings, allowing for mounting of two semiconductor wafers. A benefit of a reaction chamber with two opening can be that the reaction chamber is small and uncomplex to operate, making it accessible for small laboratories.

Figure 6:
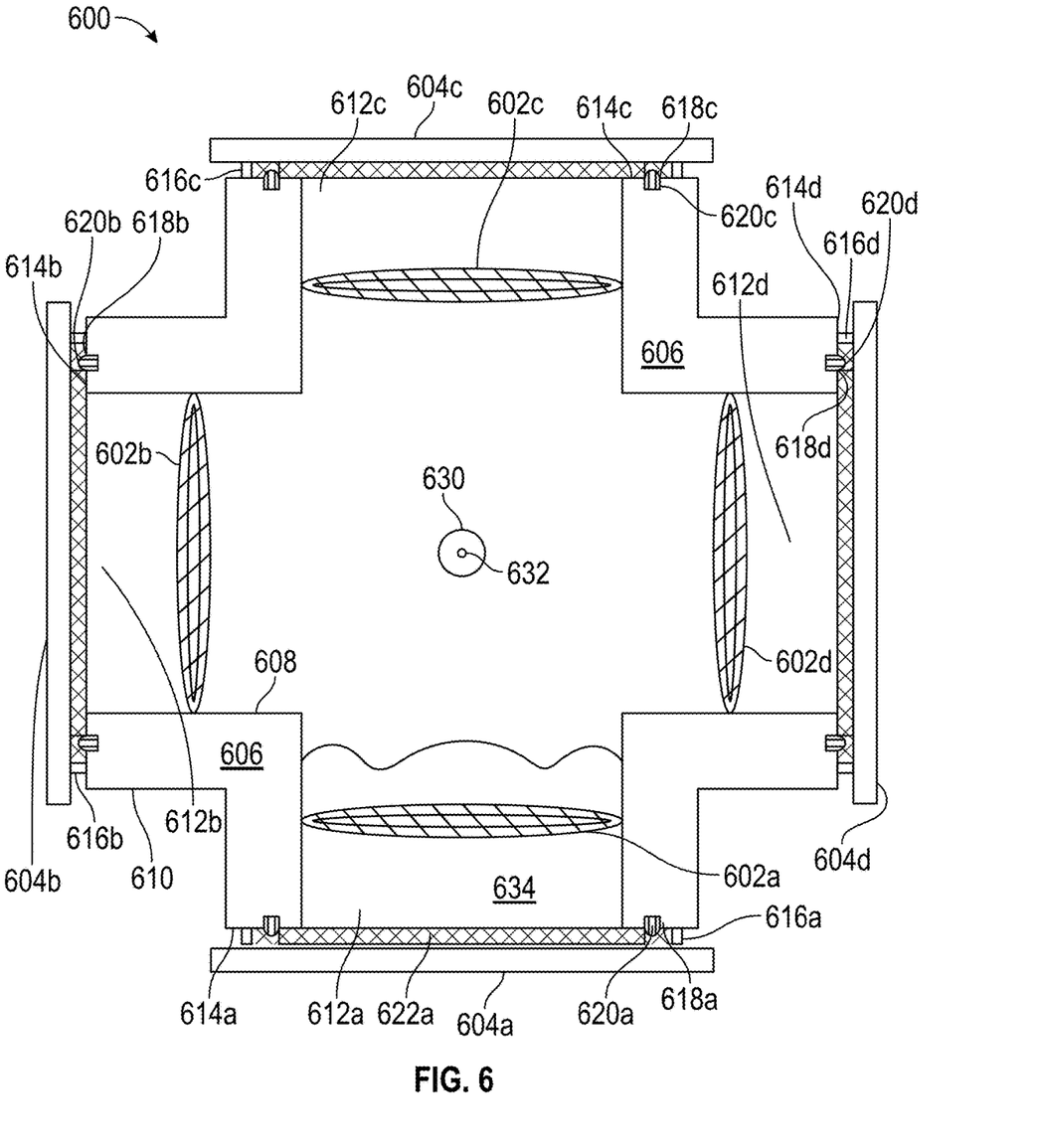
FIG. 6 is a cross sectional view of an embodiment of the reaction chamber having four openings, each holding a semiconductor wafer for treatment.

In some embodiments, the reaction chamber of the present disclosure can be configured with more than two openings to hold more than two semiconductor wafers for more efficient processing. For example, FIG. 6 illustrates a cross sectional view of a variant of the reaction chamber of the present disclosure having four openings, each holding a separate semiconductor wafer. As can be seen from FIG. 6, the reaction chamber 600 includes a first mesh cathode 602*a*, a second mesh cathode 602*b*, a third mesh cathode 602*c*, and a fourth mesh cathode 602*d*, paired with a respective anode, namely, first anode 604*a*, a second anode 604*b*, a third anode 604*c*, and a fourth anode 604*d*. A benefit of such an anode and cathode pairing can be a controlled distance between the part of each respective anode and cathode, such that an electrochemical gradient is avoided or minimized.

During operation, the reaction chamber body 606 can be rotated by a central axle 630, which rotates around a central pivot point 632. In some embodiments, the reaction chamber body 606 is hollow and include an interior surface 608, an exterior surface 610, a first opening 612*a*, a second opening 612*b*, a third opening 612*c*, and a fourth opening 612*d*.

In more detail, the reaction chamber is disclosed with particular emphasis on each opening. FIG. 6 illustrates a cut away view of the reaction chamber. Regarding the first opening, as can be seen from FIG. 6, the reaction chamber 600 includes a first mesh cathode 602*a*, a first anode 604*a*, and a reaction chamber body 606. In some embodiments, the reaction chamber body 606 is hollow and includes an interior surface 608, exterior surface 610, and a first opening 612*a*. The first opening 612*a* has a first lip 614*a*. The first anode 604*a* can be reversibly fastened to the first lip 614*a* by a first fastener (not shown). A first semiconductor wafer 622*a* is positioned between the first lip 614*a* and the first anode 604*a*. In some embodiments, the first lip 614*a* includes a first peg 616*a* and a first recess 618*a* that extends around the first opening 612*a*. In some embodiments, the first recess 618*a* is located closer to the interior surface 608 than the first peg 614*a*. In some embodiments, the first lip 614*a* includes from 3 to 20 first pegs, collectively, shown as 614*a*. In some embodiments, the reaction chamber 600 includes a first gasket 620*a* configured to fit or housed in the first recess 618*a* to create a reversibly sealable and leak-proof reaction chamber to prevent an etching solution 634, such as a HF solution, from leaking from the reaction chamber during use or storage.

Regarding the second opening, as can be seen from FIG. 6, the reaction chamber 600 includes a second mesh cathode 602*b*, a second anode 604*b*, and a reaction chamber body 606. In some embodiments, the reaction chamber body 606 is hollow and defines an interior surface 608, exterior surface 610, a second opening 612*b*. The second opening 612*b* has a second lip 614*b*. The second anode 604*b* can be reversibly fastened to the second lip 614*b* by a second fastener (not shown). A second semiconductor wafer 622*b* is positioned between the second lip 614*b* and the second anode 604*b*. In some embodiments, the second lip 614*b* includes a second peg 616*b* and a second recess 618*b* that extends around the second opening 612*b*. In some embodiments, the second recess 618*b* is located closer to the interior surface 608 than the second peg 614*b*. In some embodiments, the second lip 614*b* includes from 3 to 20 second pegs, collectively, shown as 614*b*. In some embodiments, the reaction chamber 600 includes a second gasket 620*b* configured to fit the second recess 618*b* to create a reversibly sealable and leak-proof reaction chamber to prevent an etching solution 634, such as a HF solution, from leaking from the reaction chamber during operation or storage.

Regarding the third opening, as can be seen from FIG. 6, the reaction chamber 600 includes a third mesh cathode 602*c*, a third anode 604*c*, and a reaction chamber body 606. In some embodiments, the reaction chamber body 606 is hollow and defines an interior surface 608, exterior surface 610, a third opening 612*c*. The third opening 612*c* has a third lip 614*c*. The third anode 604*c* can be reversibly fastened to the third lip 614*c* by a third fastener (not shown). A third semiconductor wafer 622*c* is positioned between the third lip 614*c* and the third anode 604*c*. In some embodiments, the third lip 614*c* includes a third peg 616*c* and a third recess 618*c* that extends around the third opening 612*c*. In some embodiments, the third recess 618*c* is located closer to the interior surface 608 than the third peg 614*c*. In some embodiments, the third lip 614*c* includes from 3 to 20 third pegs, collectively, shown as 614*c*. In some embodiments, the reaction chamber 600 includes a third gasket 620*c* configured to fit the third recess 618*c* to create a reversibly sealable and leak-proof reaction chamber to prevent an etching solution 634, such as a HF solution, from leaking from the reaction chamber during operation or storage.

Regarding the fourth opening, as can be seen from FIG. 6, the reaction chamber 600 includes a fourth mesh cathode 602*d*, a fourth anode 604*d*, and a reaction chamber body 606. In some embodiments, the reaction chamber body 606 is hollow and defines an interior surface 608, exterior surface 610, a fourth opening 612*d*. The fourth opening 612*d* has a fourth lip 614*d*. The fourth anode 604*d* can be reversibly fastened to the fourth lip 614*d* by a fourth fastener (not shown). A fourth semiconductor wafer 622*d* is positioned between the fourth lip 614*d* and the fourth anode 604*d*. In some embodiments, the fourth lip 614*d* includes a fourth peg 616*d* and a fourth recess 618*d* that extends around the fourth opening 612*d*. In some embodiments, the fourth recess 618*d* is located closer to the interior surface 608 than the fourth peg 614*d*. In some embodiments, the fourth lip 614*d* includes from 3 to 20 fourth pegs, collectively, shown as 614*d*. In some embodiments, the reaction chamber 600 includes a fourth gasket 620*d* configured to fit the fourth recess 618*d* to create a reversibly sealable and leak-proof reaction chamber to prevent an etching solution 634, such as a HF solution, from leaking from the reaction chamber during operation or storage. In some embodiments, the reaction chamber could have 4, 6, 8, 12, or more openings.

In operation, in some embodiments, in a manner similar to the assembly of the reaction chamber with two openings, the reaction chamber is assembled by positioning a first semiconductor wafer on the first lip, aligning the first semiconductor wafer with the O-ring with the help of first pegs, followed by positioning and fastening the first anode to the first lip with the help of the first fasteners (such as screws or bolts) such that the first semiconductor wafer is sandwiched therebetween. Then the reaction chamber can be rotated such that the second opening is parallel to and facing away from the ground (i.e. the second opening is on the top and farthest from the ground as compared to other openings); positioning the second semiconductor wafer on the second lip, aligning the second semiconductor wafer with the O-ring with the help of second pegs, followed by positioning and fastening the second anode to the second lip with the help of the second fasteners (such as screws) such that the second semiconductor wafer is sandwiched therebetween; rotating the reaction cell such that the third opening is parallel to and facing away from the ground (i.e. the third opening is on the top and farthest from the ground as compared to other openings); positioning the third semiconductor wafer on the third lip, aligning the third semiconductor wafer with the O-ring with the help of third pegs, followed by positioning and fastening the third anode to the third lip with the help of the third fasteners (such as screws) such that the third semiconductor wafer is sandwiched therebetween; rotating the reaction cell such that the fourth opening is parallel to and facing away from the ground (i.e. the fourth opening is on the top and farthest from the ground as compared to other openings); positioning the fourth semiconductor wafer on the fourth lip, aligning the fourth semiconductor wafer with the O-ring with the help of fourth pegs, followed by positioning and fastening the fourth anode to the fourth lip with the help of the fourth fasteners (such as screws) such that the fourth semiconductor wafer is sandwiched therebetween to create a sealed reaction chamber.

In some embodiments of the method, the etching solution can be safely added to the reaction chamber before, during, or after any semiconductor wafer on its respective lip. In some embodiments of the methods, the etching solution can be added in the etching chamber before, during, or after the entire reaction chamber is sealed using a liquid port. In some embodiments of the method, the sealed reaction chamber can be oriented such that the anode corresponding to the wafer that needs to be etched first is substantially perpendicular to gravity and closer to the ground than the other anodes, and a sufficient DC current is applied between the mesh cathode and the anode closer to the ground to effect or induce electrochemical etching of the corresponding semiconductor wafer. In some embodiments of the method, for example, the sealed reaction chamber can be oriented such that the first anode is substantially perpendicular to gravity and closer to the ground than the other anodes (exposing the first semiconductor wafer to the etching solution), DC current is applied between the mesh cathode and the first anode to effect etching of the first semiconductor wafer, and once etching of the first semiconductor wafer is complete, then the reaction cell can be rotated such that the second anode is substantially perpendicular to gravity and closer to the ground than other anodes, exposing the second semiconductor wafer to the etching solution. In some embodiments of the method, a DC current can then be applied between the mesh cathode and the second anode to effect etching of the second semiconductor wafer. In some embodiments of the method, once etching of the second semiconductor wafer is complete, the reaction cell is again rotated such that the third anode is substantially perpendicular to gravity and closer to the ground than other anodes, exposing the third semiconductor wafer to the etching solution. In some embodiments of the method, a DC current can then be applied between the mesh cathode and the third anode to effect etching of the third semiconductor wafer. In some embodiments of the method, once etching of the third semiconductor wafer is complete, the reaction cell is again rotated such that the fourth anode is substantially perpendicular to gravity and closer to the ground than other anodes, exposing the fourth semiconductor wafer to the etching solution. In some embodiments of the method, a DC current can then be applied between the mesh cathode and the fourth anode to effect etching of the fourth semiconductor wafer. In some embodiments of the method, the etched semiconductor wafer(s) can be removed and/or be replaced with a new semiconductor wafer (to be etched) or an unetched semiconductor wafer before, during, or after etching of any of: the second semiconductor wafer, the third semiconductor wafer, and the fourth semiconductor wafer. In some embodiments of the method, this process is repeated to effect etching of the semiconductor wafers potentially using the same etching solution until depletion of the etching solution, preventing or reduction the need to drain and store the etching solution after each etching cycle.

Although the presently disclosed reaction chamber and methods were designed to provide safe, efficient devices and methods for electrochemically etching semiconductor wafers with HF solutions, the embodiments of the reaction chamber, and methods can be used with other treatment solutions and other substrates for other types of treatment. In some embodiments, the method includes adding an HF acid or HF containing solution to the reaction chamber. In some embodiments, the method includes adding a treatment solution, such as a caustic base, such as KOH or NOH solutions. In some embodiments, the semiconductor wafers can include a semiconductor wafer comprising crystalline silicon. In some embodiments, the semiconductor wafer can include gallium nitride. In some embodiments of the methods disclosed herein, no current is applied during treatment step and the treatment solution is merely brought into contact with a surface of the semiconductor to facilitate treatment.

Further Discussion of Embodiments

Embodiment 1. A reaction chamber comprising:
a mesh cathode, a first anode, a second anode, and a reaction chamber body,
wherein the reaction chamber body is hollow and has an interior surface, an exterior surface, a first opening with a first lip, and a second opening with a second lip,
wherein the mesh cathode is positioned between the first opening and the second opening and the mesh cathode is substantially parallel to the first lip,
wherein the first anode can be reversibly fastened to the first lip by a first fastener and the second anode can be reversibly fastened to the second lip by a second fastener.

Embodiment 2. The reaction chamber of one or more of Embodiments 1-7, wherein an inner edge of the first lip has a shortest distance across the first opening of from about 2.5 cm to about 46.0 cm, or an inner edge of the of the second lip has a shortest distance across the second opening of from about 2.5 cm to about 46.0 cm; or
wherein the first opening has a circular shape having an internal diameter of from about 2.5 cm to about 46.0 cm, or the wherein the second opening has a circular shape having an internal diameter of from about 2.5 cm to about 46.0 cm; or
wherein the first opening and the second opening have a circular shape having an internal diameter and the internal diameter is from about 2.0 mm to about 5.0 mm less than the diameter of a semiconductor wafer.

Embodiment 3. The reaction chamber of one or more of Embodiments 1-7, wherein the reaction chamber contains no more than one mesh cathode, and the mesh cathode is located within from about 0.0 mm to about 5.0 mm and substantially parallel to an equidistant line between the first anode and the second anode; or
wherein the mesh cathode is located from about 1.0 cm to about 10 cm to the first anode or the mesh cathode is located from about 1.0 cm to about 10 cm to the second anode; or
wherein the reaction chamber contains a first mesh cathode and a second mesh cathode, and wherein the first mesh cathode is located at a distance of from about 1.0 cm to about 10 cm from the first anode and substantially parallel to the first anode or wherein the second mesh cathode is located at a distance of from about 1.0 cm to about 10 cm from the second anode and substantially parallel to the second anode.

Embodiment 4. The reaction chamber of one or more of Embodiments 1-7, wherein the first lip includes from 3 to 20 first pegs and a first recess that extends around the first opening, wherein the first recess is located closer to the interior surface than the pegs; or
wherein the second lip includes from 3 to 20 second pegs and a second recess that extends around the second opening, wherein the second recess is located closer to the interior surface than the second pegs.

Embodiment 5. The reaction chamber of one or more of Embodiments 1-7, further comprising a first gasket, wherein the first gasket is configured to fit the first recess; or
　further comprising a second gasket, wherein the second gasket is configured to fit the second recess; or
　wherein at least one of the first gasket and the second gasket is an O-ring; and
　wherein the first gasket and the second gasket comprise a rubber, an elastomer, or a fluoropolymer.

Embodiment 6. The reaction chamber of one or more of Embodiments 1-7, wherein the reaction chamber body comprises a polymer or a fluoropolymer; or
　wherein the mesh cathode comprises a nickel alloy or a nickel copper alloy; or
　wherein at least one of the first anode and the second anode comprises a nickel alloy, a nickel copper alloy, a p-doped silicon plate, or an n-doped silicon plate, or a combination thereof.

Embodiment 7. The reaction chamber of one or more of Embodiments 1-7, wherein the mesh cathode is electrically connected through the reaction chamber body to a DC power source; or wherein the reaction chamber body comprises a liquid port, wherein the liquid port is a tube that extends through the reaction chamber body through the exterior surface to the exterior surface.

Embodiment 8. A method of operating a reaction chamber comprising:
　providing a reaction chamber, wherein the reaction chamber includes,
　a mesh cathode, a first anode, a second anode, and a reaction chamber body,
　wherein the reaction chamber body is hollow and has an interior surface, an exterior surface, a first opening with a first lip, and a second opening with a second lip,
　wherein the mesh cathode is positioned between the first opening and the second opening and the mesh cathode is substantially parallel to the first lip,
　wherein the first anode can be reversibly fastened to the first lip by a first fastener and the second anode can be reversibly fastened to the second lip by a second fastener, forming a sealed reaction chamber by,
　forming a first seal between a first semiconductor wafer and the first lip by positioning the first semiconductor wafer between the first lip and the first anode,
　forming a second seal between a second semiconductor wafer and the second lip by positioning the second semiconductor wafer between the second lip and the second anode, and adding a reactant to the sealed reaction chamber.

Embodiment 9. The method of operating a reaction chamber of one or more of Embodiments 8-15, further comprising:
　orienting the sealed reaction chamber by positioning the second anode substantially perpendicular to gravity and closer to a ground than the first anode, and
　etching a second surface of the second semiconductor wafer by applying a DC current between the mesh cathode and the second anode.

Embodiment 10. The method of operating a reaction chamber of one or more of Embodiments 8-15, further comprising:
　orienting the sealed reaction chamber by positioning the first anode substantially perpendicular to gravity and closer to the ground than the second anode, and
　etching a first surface of the first semiconductor wafer by applying a DC current between the mesh cathode and the first anode.

Embodiment 11. The method of operating a reaction chamber of one or more of Embodiments 8-15, further comprising removing the second semiconductor wafer before, during, or after etching the first semiconductor wafer by applying DC current between the mesh cathode and the first anode.

Embodiment 12. The method of operating a reaction chamber of one or more of Embodiments 8-15, further comprising:
　orienting the sealed reaction chamber by positioning the first anode substantially perpendicular to gravity and closer to a ground than the second anode, and
　etching a first surface of the first semiconductor wafer by applying a DC current between the mesh cathode and the first anode.

Embodiment 13. The method of operating a reaction chamber of one or more of Embodiments 8-15, further comprising:
　orienting the sealed reaction chamber by positioning the second anode substantially perpendicular to gravity and closer to a ground than the first anode, and
　etching a second surface of the second semiconductor wafer by applying a DC current between the mesh cathode and the second anode.

Embodiment 14. The method of operating a reaction chamber of one or more of Embodiments 8-15, wherein the reactant comprises HF.

Embodiment 15. The method of operating a reaction chamber of one or more of Embodiments 8-15, further comprising:
　etching a first surface of the first semiconductor wafer by applying a DC current between the mesh cathode and the first anode, and then etching a second surface of the second semiconductor wafer by applying a DC current between the mesh cathode and the second anode; or etching a second surface of the second semiconductor wafer by applying a DC current between the mesh cathode and the second anode, and then etching a first surface of the first semiconductor wafer by applying a DC current between the mesh cathode and the first anode.

Examples

Etching Chamber Construction

An exemplary rotatable double electrochemical etching cell can be designed and machined for a 150 mm wafer as described below. The complete etching cell consists of three main parts:

1) Cylindrical etching chamber with an O-ring on both ends for wafer mounting and sealing. This two ends design allows sealing the electrochemical (EC) cell with solution inside by two mounted wafers. Then an operator can move around, rotate, flip or even shake the cell without concerning spilling of hazardous chemicals. In a practical EC etching operation, the operator can mount a wafer on one end, complete electrochemical etching on the wafer, and then mount and seal another wafer on other end, flip the cell over without handling and leaking the HF based etching solution, then remove the 1st wafer and complete EC etching of second wafer. This procedure can be repeated many times, thus to minimize HF handling and usage, and save processing time. The positioning pins allow for easy and fast wafer aligning and correct mounting.

2) A mesh cathode fixed in the middle of chamber with a sealed connecting lead. Fixing cathode mesh in cell with connecting lead would release the need for removing and replacing cathode after EC etching of each wafer, and thus also eliminate possible solution loss, and contamination.

3) Anode plate on back supporting board mountable on both ends. Anode plate or anode on back supporting board will not contact etching solution and will be kept dry throughout the process, thus no need to wash the anode, and reduced concern for anode plate corrosion. Added screw-hole cushion pads allow fast fasten and removal of screws using powered tool without over-tightening. This system can be readily modified for industry automation using a clamping mechanism, such as a robotic arm. It is possible to etch two wafers simultaneously if placing wafers vertically, and a mechanism to release gas bubbles is used. Since most types of solutions used for electrochemical etching of porous silicon contain HF and surfactant, chemical compatible materials have to be adapted for the cell construction.

Operation Procedure

A sample operating protocol for operating the rotatable double electrochemical etching cell is described below.

1) The first silicon wafer is placed on one end cylindrical etching chamber such that it is aligned with the O-ring with some overhang. This is done by placing the wafer within the rubber stubs or pins provided to assist positioning.
2) The metal anode plate with supporting backboard is placed on top of wafer, and screw holes are aligned with the help of two Teflon pins.
3) Screws are placed in screw holes, and tightened to seal wafer against O-ring on the etching cell.
4) Turn over the assembled cell so that the open end of cylinder is facing up. Etching solution is infused into the etching cell assembly. Electrodes are connected to the power supply and program-controlled electrical current is supplied to obtain porous silicon structure.
5) For the next wafer, the wafer is placed on the top side of the etching cell assembly, by placing the wafer within the stubs or pins provided to assist positioning.
6) The second metal anode plate with backboard is placed on top and screw holes are aligned with the help of two Teflon pins.
7) Screws are placed in screw holes and tightened to seal the etching cell.
8) The cell is flipped over so that the newly placed wafer is at the bottom and the first etched wafer is on the top of the assembly.
9) The screws on the top plate are loosened and removed to free the top anode plate. Then the anode plate with backboard is removed from the top of the etching assembly. The first etched wafer is removed from the assembly and ready for DI water rinse.
10) The electrodes are connected to the power supply and programmed electrical current is provided to etch the second wafer for porous silicon structure.
11) Then third wafer is place on the top of cell. The above-described procedure is repeated to get more wafer etched in the same solution or HF compensated solution.

HF Consumption and Replacement

Electrochemical etching of porous silicon will consume HF. The consumed amount of HF can be calculated correspondingto the total electrical current applied during the process. Thus compensation of HF to maintain certain HF concentration is easily performed. For production of multi-layer stacks of porous silicon disks on 150 mm micropillar wafers, we estimate about 0.4% HF consumed for EC etching of 10 layers particles per wafer in 12.5% HF etching solution.

What is claimed is:

1. A reaction chamber comprising:
a mesh cathode or a porous cathode, a first anode, a second anode, and a reaction chamber body,
wherein the reaction chamber body is hollow and has an interior surface, an exterior surface, a first opening with a first lip, and a second opening with a second lip,
wherein the mesh cathode or the porous cathode is positioned between the first opening and the second opening and the mesh cathode or the porous cathode is substantially parallel to the first lip,
wherein the first anode is reversibly fastened to the first lip by a first fastener and the second anode is reversibly fastened to the second lip by a second fastener,
wherein a first semiconductor wafer is positioned between the first lip and the first anode.

2. The reaction chamber of claim 1, wherein an inner edge of the first lip has a shortest distance across the first opening of from about 2.5 cm to about 46.0 cm, or an inner edge of the of the second lip has a shortest distance across the second opening of from about 2.5 cm to about 46.0 cm; or
wherein the first opening has a circular shape having an internal diameter of from about 2.5 cm to about 46.0 cm, or the wherein the second opening has a circular shape having an internal diameter of from about 2.5 cm to about 46.0 cm; or
wherein the first opening and the second opening have a circular shape having an internal diameter and the internal diameter is from about 2.0 mm to about 5.0 mm less than the diameter of a semiconductor wafer.

3. The reaction chamber of claim 1, wherein the reaction chamber contains no more than one mesh cathode or porous cathode, and the mesh cathode or the porous cathode is located within from about 0.0 mm to about 5.0 mm and substantially parallel to an equidistant line between the first anode and the second anode; or
wherein the reaction chamber contains a first mesh cathode or a first porous cathode and a second mesh cathode or a second porous cathode, and wherein the first mesh cathode or first porous cathode is located at a distance of from about 1.0 cm to about 10 cm from the first anode
and substantially parallel to the first anode or wherein the second mesh cathode or the second.

4. The reaction chamber of claim 1, wherein the first lip includes from 3 to 20 first pegs and a first recess that extends around the first opening, wherein the first recess is located closer to the interior surface than the first pegs; or
wherein the second lip includes from 3 to 20 second pegs and a second recess that extends around the second opening, wherein the second recess is located closer to the interior surface than the second pegs.

5. The reaction chamber of claim 4, further comprising a first gasket, wherein the first gasket is configured to fit the first recess; or
further comprising a second gasket, wherein the second gasket is configured to fit the second recess; or
wherein at least one of the first gasket and the second gasket is an O-ring; and
wherein the first gasket and the second gasket comprise a rubber, an elastomer, or a fluoropolymer.

6. The reaction chamber of claim 1, wherein the reaction chamber body comprises a polymer or a fluoropolymer; or
wherein the mesh cathode or the porous cathode comprises a nickel alloy or a nickel copper alloy; or wherein at least one of the first anode and the second anode comprises a nickel alloy, a nickel copper alloy, a p-doped silicon plate, or an n-doped silicon plate, or a combination thereof.

7. The reaction chamber of claim 1, wherein the mesh cathode or the porous cathode is electrically connected through the reaction chamber body to a DC power source; or
porous cathode is located at a distance of from about 1.0 cm to about 10 cm from the second anode and substantially parallel to the second anode;
wherein the reaction chamber body comprises a liquid port, wherein the liquid port is a tube that extends through the reaction chamber body through the exterior surface to the exterior surface.

8. The reaction chamber of claim 1, wherein the mesh cathode or the porous cathode is located from about 1.0 cm to about 10 cm to the first anode or the mesh cathode or the porous cathode is located from about 1.0 cm to about 10 cm to the second anode.

9. A method of operating a reaction chamber comprising:
providing a reaction chamber, wherein the reaction chamber includes,
a mesh cathode, a first anode, a second anode, and a reaction chamber body,
wherein the reaction chamber body is hollow and has an interior surface, an exterior surface, a first opening with a first lip, and a second opening with a second lip,
wherein the mesh cathode is positioned between the first opening and the second opening and the mesh cathode is substantially parallel to the first lip,
wherein the first anode can be reversibly fastened to the first lip by a first fastener and the second anode can be reversibly fastened to the second lip by a second fastener,
a mesh cathode or a porous cathode, a first anode, a second anode, and a reaction chamber body,
wherein the reaction chamber body is hollow and has an interior surface, an exterior surface, a first opening with a first lip, and a second opening with a second lip,
wherein the mesh cathode or the porous cathode is positioned between the first opening and the second opening and the mesh cathode or the porous cathode is substantially parallel to the first lip,
wherein the first anode is reversibly fastened to the first lip by a first fastener and the second anode is reversibly fastened to the second lip by a second fastener,
wherein a first semiconductor wafer is positioned between the first lip and the first anode,
forming a sealed reaction chamber by,
forming a first seal between the first semiconductor wafer and the first lip by positioning the first semiconductor wafer between the first lip and the first anode,
forming a second seal between a second semiconductor wafer and the second lip by positioning the second semiconductor wafer between the second lip and the second anode, and
adding a reactant to the sealed reaction chamber.

10. The method of claim 9, further comprising:
orienting the sealed reaction chamber by positioning the second anode substantially perpendicular to gravity and closer to a ground than the first anode, and
etching a second surface of the second semiconductor wafer by applying a DC current between the mesh cathode or the porous cathode and the second anode.

11. The method of claim 10, further comprising:
orienting the sealed reaction chamber by positioning the first anode substantially perpendicular to gravity and closer to the ground than the second anode, and
etching a first surface of the first semiconductor wafer by applying a DC current between the mesh cathode or the porous cathode and the first anode.

12. The method of claim 11, further comprising removing the second semiconductor wafer before, during, or after etching the first semiconductor wafer by applying DC current between the mesh cathode or the porous cathode and the first anode.

13. The method of claim 9, further comprising:
orienting the sealed reaction chamber by positioning the first anode substantially perpendicular to gravity and closer to a ground than the second anode, and
etching a first surface of the first semiconductor wafer by applying a DC current between the mesh cathode or the porous cathode and the first anode.

14. The method of claim 13, further comprising:
orienting the sealed reaction chamber by positioning the second anode substantially perpendicular to gravity and closer to a ground than the first anode, and
etching a second surface of the second semiconductor wafer by applying a DC current between the mesh cathode or the porous cathode and the second anode.

15. The method of claim 9, wherein the reactant comprises HF.

16. The method of claim 9, further comprising:
etching a first surface of the first semiconductor wafer by applying a DC current between the mesh cathode or the porous cathode and the first anode, and then etching a second surface of the second semiconductor wafer by applying a DC current between the mesh cathode or the porous cathode and the second anode; or
etching a second surface of the second semiconductor wafer by applying a DC current between the mesh cathode or the porous cathode and the second anode, and then etching a first surface of the first semiconductor wafer by applying a DC current between the mesh cathode or the porous cathode and the first anode.

* * * * *